(12) United States Patent
Karhade et al.

(10) Patent No.: US 11,764,080 B2
(45) Date of Patent: Sep. 19, 2023

(54) LOW COST PACKAGE WARPAGE SOLUTION

(71) Applicant: Intel Corporation, Santa Clara, CA (US)

(72) Inventors: Omkar G. Karhade, Chandler, AZ (US); Nitin A. Deshpande, Chandler, AZ (US); Debendra Mallik, Chandler, AZ (US); Bassam M. Ziadeh, Laveen, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/715,923

(22) Filed: Apr. 7, 2022

(65) Prior Publication Data

US 2022/0230892 A1     Jul. 21, 2022

Related U.S. Application Data

(60) Continuation of application No. 16/915,290, filed on Jun. 29, 2020, now Pat. No. 11,328,937, which is a
(Continued)

(51) Int. Cl.
*H01L 21/56* (2006.01)
*H01L 25/00* (2006.01)
(Continued)

(52) U.S. Cl.
CPC ............ *H01L 21/563* (2013.01); *H01L 23/16* (2013.01); *H01L 23/562* (2013.01); *H01L 24/97* (2013.01);
(Continued)

(58) Field of Classification Search
CPC ...... H01L 21/563; H01L 23/16; H01L 23/562
See application file for complete search history.

(56) References Cited

U.S. PATENT DOCUMENTS 6,078,506 A     6/2000   Sugahara
6,112,875 A     9/2000   Gibson
(Continued)

FOREIGN PATENT DOCUMENTS

JP     H-08-288321     11/1996
JP     2000-243867     9/2000
(Continued)

OTHER PUBLICATIONS

Office Action—Japanese Patent Application No. 2015-219436, dated Nov. 1, 2016; 9 pages.
(Continued)

*Primary Examiner* — Thao P Le
(74) *Attorney, Agent, or Firm* — Schwabe, Williamson & Wyatt, P.C.

(57) ABSTRACT

Embodiments of the invention include device packages and methods of forming such packages. In an embodiment, the method of forming a device package may comprise forming a reinforcement layer over a substrate. One or more openings may be formed through the reinforcement layer. In an embodiment, a device die may be placed into one of the openings. The device die may be bonded to the substrate by reflowing one or more solder bumps positioned between the device die and the substrate. Embodiments of the invention may include a molded reinforcement layer. Alternative embodiments include a reinforcement layer that is adhered to the surface of the substrate with an adhesive layer.

20 Claims, 7 Drawing Sheets

Related U.S. Application Data continuation of application No. 16/515,981, filed on Jul. 18, 2019, now Pat. No. 10,741,419, which is a continuation of application No. 15/899,222, filed on Feb. 19, 2018, now Pat. No. 10,403,512, which is a division of application No. 14/576,166, filed on Dec. 18, 2014, now Pat. No. 9,899,238.

(51) Int. Cl.
  *H01L 25/065* (2023.01)
  *H01L 23/00* (2006.01)
  *H01L 25/18* (2023.01)
  *H01L 23/16* (2006.01)

(52) U.S. Cl.
  CPC .......... *H01L 25/0657* (2013.01); *H01L 25/18* (2013.01); *H01L 25/50* (2013.01); *H01L 24/13* (2013.01); *H01L 24/14* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/0401* (2013.01); *H01L 2224/131* (2013.01); *H01L 2224/13082* (2013.01); *H01L 2224/13124* (2013.01); *H01L 2224/13144* (2013.01); *H01L 2224/13147* (2013.01); *H01L 2224/14181* (2013.01); *H01L 2224/16145* (2013.01); *H01L 2224/16225* (2013.01); *H01L 2224/16227* (2013.01); *H01L 2224/26175* (2013.01); *H01L 2224/32225* (2013.01); *H01L 2224/48091* (2013.01); *H01L 2224/48228* (2013.01); *H01L 2224/48465* (2013.01); *H01L 2224/73204* (2013.01); *H01L 2224/73265* (2013.01); *H01L 2224/81007* (2013.01); *H01L 2224/81011* (2013.01); *H01L 2224/81191* (2013.01); *H01L 2224/81192* (2013.01); *H01L 2224/81203* (2013.01); *H01L 2224/81211* (2013.01); *H01L 2224/81815* (2013.01); *H01L 2224/83192* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06568* (2013.01); *H01L 2924/00014* (2013.01); *H01L 2924/1434* (2013.01); *H01L 2924/1579* (2013.01); *H01L 2924/15311* (2013.01); *H01L 2924/181* (2013.01); *H01L 2924/2064* (2013.01); *H01L 2924/3511* (2013.01)

(56) References Cited

U.S. PATENT DOCUMENTS

| | | | |
|---|---|---|---|
| 6,277,672 B1 | 8/2001 | Ho | |
| 6,395,124 B1 | 5/2002 | Oxman | |
| 8,836,098 B1 * | 9/2014 | Sukemi | H01L 23/49816 257/737 |
| 8,907,478 B2 | 12/2014 | Tsai | |
| 2001/0016370 A1 | 8/2001 | Ho | |
| 2002/0063319 A1 | 5/2002 | Huang et al. | |
| 2003/0170450 A1 | 9/2003 | Stewart | |
| 2005/0040524 A1 | 2/2005 | Pu | |
| 2006/0125113 A1 | 6/2006 | Liu | |
| 2007/0013043 A1 | 1/2007 | Pan | |
| 2008/0185716 A1 | 8/2008 | Huang et al. | |
| 2009/0095518 A1 | 4/2009 | Matsushita | |
| 2010/0003787 A1 | 1/2010 | Wang | |
| 2010/0055812 A1 | 3/2010 | Lin | |
| 2010/0167436 A1 | 7/2010 | Lin | |
| 2011/0042830 A1 | 2/2011 | Tarantino | |
| 2011/0096507 A1 | 4/2011 | Deram | |
| 2011/0171785 A1 | 7/2011 | Lin | |
| 2012/0094442 A1 | 4/2012 | Lin | |
| 2012/0129300 A1 | 5/2012 | Lin | |
| 2012/0228754 A1 | 9/2012 | Liu | |
| 2013/0221485 A1 | 8/2013 | Kim | |
| 2014/0091461 A1 | 4/2014 | Shen | |
| 2015/0031200 A1 | 1/2015 | Tsai | |
| 2015/0061142 A1 | 3/2015 | Hsu | |
| 2015/0165587 A1 | 6/2015 | Lin | |
| 2015/0348954 A1 * | 12/2015 | Chandolu | H01L 24/11 257/737 |
| 2015/0364428 A1 | 12/2015 | Hayashiyama | |
| 2016/0181218 A1 * | 6/2016 | Karhade | H01L 25/18 257/737 |
| 2017/0263570 A1 * | 9/2017 | Lin | H01L 24/16 |
| 2018/0350755 A1 * | 12/2018 | Huang | H01L 25/18 |
| 2019/0206833 A1 * | 7/2019 | Meyer | H01L 25/0652 |
| 2020/0286847 A1 * | 9/2020 | Liu | H01L 24/13 |
| 2021/0183776 A1 * | 6/2021 | Cheah | H01L 24/11 |
| 2021/0384159 A1 * | 12/2021 | Ko | H01L 25/50 |
| 2022/0157732 A1 * | 5/2022 | Tsai | H01L 24/20 |
| 2022/0278084 A1 * | 9/2022 | Ong | H01L 23/5385 |
| 2022/0359488 A1 * | 11/2022 | Yu | H01L 23/49827 |
| 2023/0116326 A1 * | 4/2023 | Yang | H01L 23/49816 257/774 |

FOREIGN PATENT DOCUMENTS

| | | |
|---|---|---|
| JP | 2004-158474 | 6/2004 |
| JP | WO-2014/041684 | 8/2006 |
| JP | 2009-094195 | 4/2009 |
| JP | 2010-205887 | 9/2010 |
| KR | 10-2009-0035452 | 4/2009 |
| TW | I251316 | 3/2006 |
| TW | I317995 | 12/2009 |

OTHER PUBLICATIONS

Notice of Allowance—Japanese Patent Application No. 2015-219436, dated Feb. 7, 2017; 1 page.
Office Action—Korean Application No. 2015-0161138, dated Mar. 14, 2017; 14 pages.
Notice of Allowance for Korean Application No. 2015-0161138, dated Aug. 30, 2017; 3 pages, with English translation.
Office Action & Search Report—Taiwanese Patent Application No. 104136699, dated Mar. 2, 2017; 9 pages.
Notice of Allowance for Taiwanese Patent Application No. 104136699, dated Dec. 18, 2017; 3 pages, with English translation.

* cited by examiner

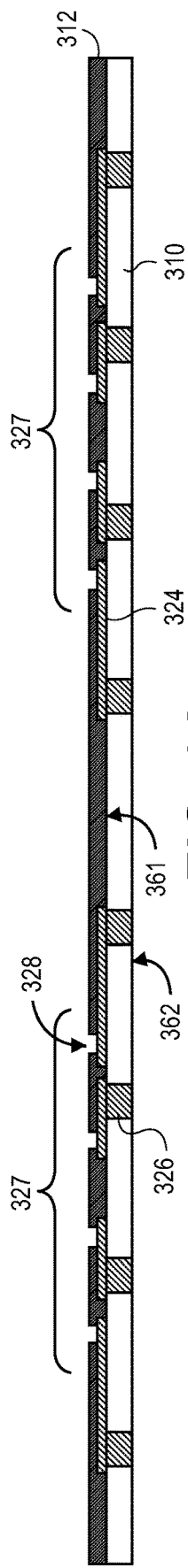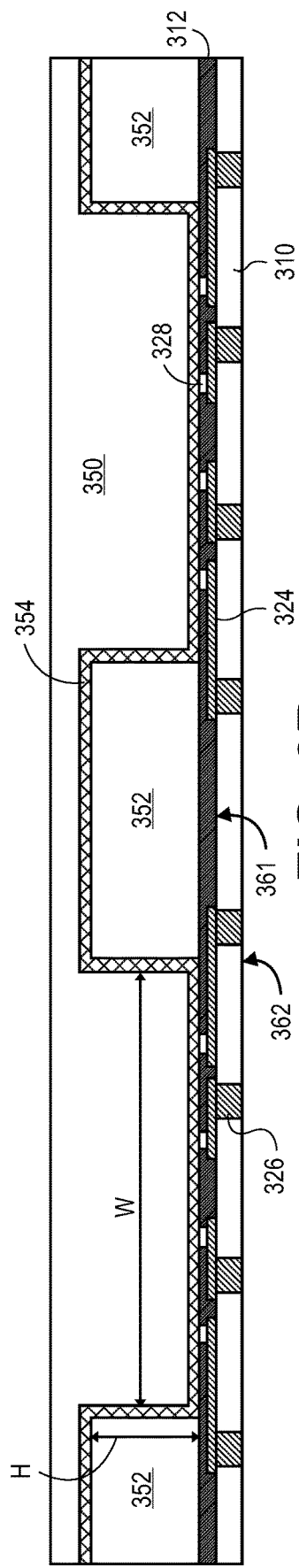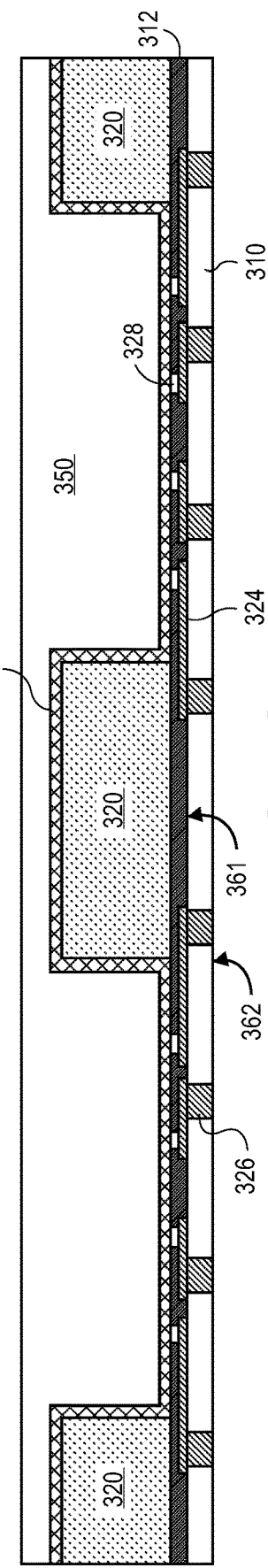

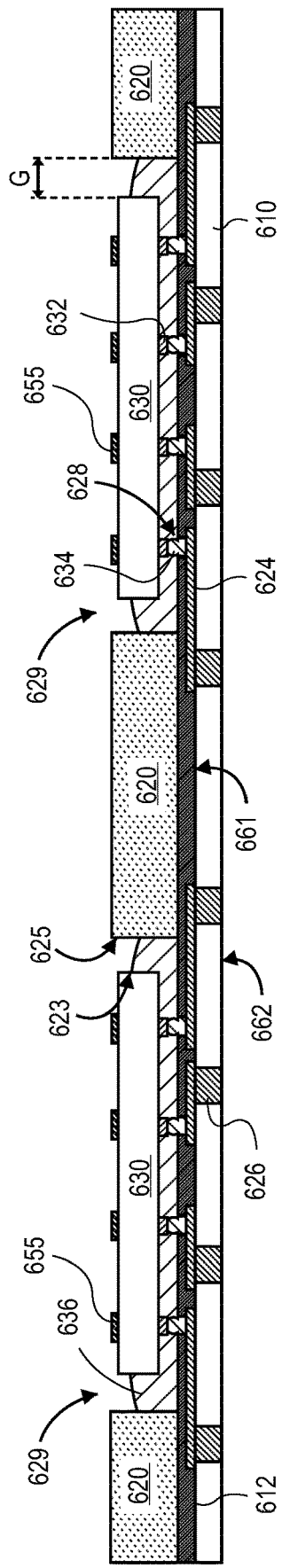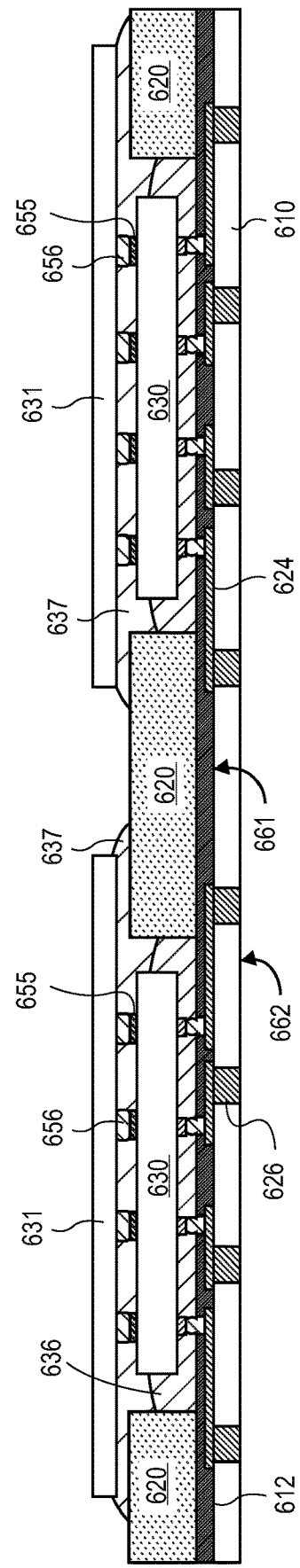

LOW COST PACKAGE WARPAGE SOLUTION

CROSS-REFERENCE TO RELATED APPLICATIONS

This application is a Continuation of U.S. patent application Ser. No. 16/915,290, filed Jun. 29, 2020, which is a Continuation of U.S. patent application Ser. No. 16/515,981, filed Jul. 18, 2019, now U.S. Pat. No. 10,741,419, issued Aug. 11, 2020, which is a Continuation of U.S. patent application Ser. No. 15/899,222, filed Feb. 19, 2018, now U.S. Pat. No. 10,403,512 issued Sep. 3, 2019, which is a Divisional of U.S. patent application Ser. No. 14/576,166, filed on Dec. 18, 2014, now U.S. Pat. No. 9,899,238, issued Feb. 20, 2018, the entire contents of which are hereby incorporated by reference herein

FIELD OF THE INVENTION

Embodiments generally relate to semiconductor devices. More specifically, embodiments relate to methods and apparatuses for packaging semiconductor dies.

BACKGROUND OF THE INVENTION

Tape ball grid array (BGA) or quad-flat no lead (QFN) packages with wirebonds are the dominant solution for producing low-cost electronic packages. FIG. 1 provides an illustration of an exemplary tape BGA package 100 that utilizes wirebonds. As illustrated, the package substrate 110 is a thin tape substrate. Conductive traces 124 may be formed over a surface of the tape substrate. For example, the conductive traces may be copper traces. The conductive traces 124 may be covered by a layer of solder resist 112. Solder resist openings 128 may be formed over portions of the conductive traces 124 to provide an opening where the wires 144 may be bonded. Wires 144 may connect the conductive traces 124 to wirebond pads 146 formed on a top surface of the device die 130. The wires 144 electrically couple the integrated circuitry (not shown) in the die 120 to the solder bumps 138 on the backside of the package substrate 110. The conductive traces 124 may be electrically coupled to the solder bumps 138 by conductive through vias 126. The device die 130 may be attached to the solder resist layer 112 by a die attach paste 149. The entire package may be covered by an encapsulation layer 140, such as an epoxy encapsulation.

However, the use of wirebond packages has significant drawbacks. For example, connecting wires to a top surface of the device die 130 results in a package thickness that is greater than electronic packages that utilize alternative interconnect techniques such as flip-chip or controlled collapsed chip connection (C4) techniques. Additionally, device dies that are packaged with wirebonding require additional processing operations to form the wirebond pads 146.

Despite the limitations associated with wirebonding, device packages formed on thin and flexible substrates have not been able to utilize flip-chip bonding for multiple reasons. First, special substrate handling systems would be required to process the tape substrate because the tape substrate is thin and flexible. The additional equipment and processing operations needed to accommodate the substrate results in an increase in the overall cost of the package. Additionally, flip-chip bonding may include a mass reflow operation. The increase in temperature during the mass reflow causes the tape substrate to permanently deform. Additionally, it may not be economically feasible to substitute thermal compression bonding (TCB) for the mass reflow process due to the high cost of TCB. Therefore, flip chip bonding that utilizes TCB instead of a mass reflow may not be an economically viable process for producing low-cost electronic packages on tape substrates.

BRIEF DESCRIPTION OF THE DRAWINGS

FIGS. 3A-3I are cross-sectional illustrations of a process for forming a tape FCBGA package, according to an embodiment of the invention.

FIGS. 6A-6B are cross-sectional illustrations of a process for forming a FCBGA package that comprises a second die, according to an embodiment of the invention.

DETAILED DESCRIPTION OF THE INVENTION

Embodiments of the invention provide apparatuses with improved warpage control for device packages and methods of forming such devices. In the following description, numerous specific details are set forth, such as specific materials and processing operations, in order to provide a thorough understanding of embodiments of the present invention. It will be apparent to one skilled in the art that embodiments of the present invention may be practiced without these specific details. In other instances, well-known features, such as the integrated circuitry of semiconductive dies, are not described in detail in order to not unnecessarily obscure embodiments of the present invention. Furthermore, it is to be understood that the various embodiments shown in the Figures are illustrative representations and are not necessarily drawn to scale.

Embodiments of the invention include a device package having a device die that is coupled to a thin substrate by a flip-chip ball grid array (FCBGA) bonding process. The use of FCBGA processing typically includes the use of a mass reflow operation in order to reflow solder bumps. As described above, thin polymer substrates, such as tape substrates, are susceptible to deformation in the presence of the heat required for mass reflow of solder bumps. Accordingly, embodiments of the invention include the formation of a reinforcement layer over the tape substrate prior to the mass reflow operation. The reinforcement layer increases the stiffness of the substrate and reduces the warpage of the tape substrate that is caused by the reflowing process. Furthermore, embodiments of the invention reduce the difficulty of handling a thin and flexible substrate because the reinforcement layer provides rigidity to the otherwise flexible substrate. A stiffer substrate allows for the substrate to be handled and processed without specialized substrate handling equipment that is typically needed for such thin and flexible substrates. Accordingly, processing equipment used in FCBGA packages formed on thick and rigid multi-layered substrates can be used for the fabrication of flexible tape FCBGA packages as well.

Figure 1:
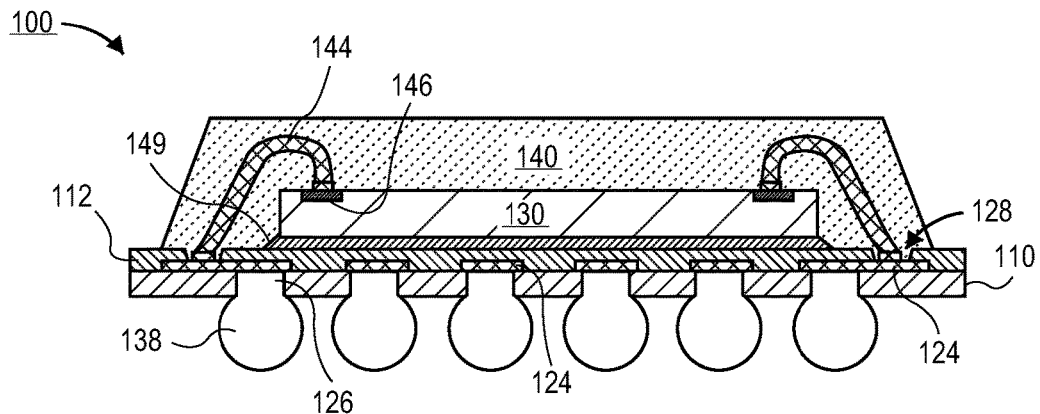
FIG. 1 is a cross-sectional illustration of a tape ball grid array package that utilizes wirebonds.
Figure 2A:
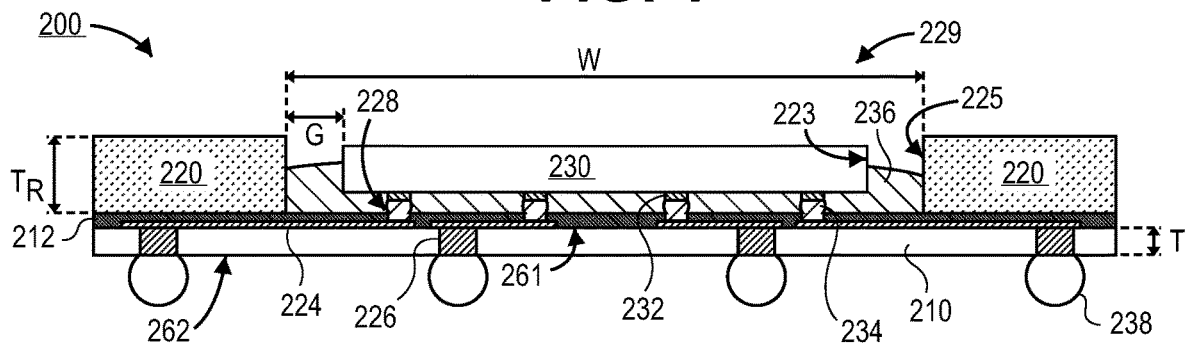
FIGS. 2A-2C are cross-sectional illustrations of tape flip-chip ball grid array (FCBGA) packages, according to embodiments of the invention.

Referring now to FIG. 2A, a cross-sectional illustration of a tape FCBGA package 200 according to an embodiment of the invention is shown. Embodiments of the invention include a tape substrate 210 that is a polymeric substrate. By way of example, the tape substrate 210 may be a polyamide or polyimide material. The tape substrate 210 may have a thickness T. By way of example, the thickness T may be less than approximately 100 μm. In an embodiment, the thickness T may be approximately 75 μm or less. In an embodiment, the tape substrate 210 may be a single layer tape substrate. Additional embodiments may also include multi-layer tape substrates, such as a substrate that includes two or more thin and flexible layers laminated together.

One or more conductive through vias 226 may be formed through the tape substrate 210. The conductive through vias 226 provide electrical connections between a first side 261 and a second side 262 of the tape substrate 210. In an embodiment, the conductive through vias 226 may be filled with a solder material. Additional embodiments include a conductive through via 226 that is a plated through hole, such as a copper plated through hole. The through vias 226 may provide an electrical connection to second level interconnect (SLI) solder balls 238 formed on the second side 262 of the tape substrate 210. The solder balls 238 may be any solder typically used for solder bonding in electrical device packages, such as, for example, lead-tin solders or lead free solders.

As illustrated, conductive traces 224 may be formed over the first side 261 of the tape substrate 210. According to an embodiment, the conductive traces 224 may be a metallic material, such as copper or the like. The conductive traces 224 provide electrical paths from reflown solder bumps 234 to a through via 226. As such, integrated circuitry in the device die 230 (not show) may be electrically coupled to the second side 262 of the tape substrate 210. In an embodiment, the reflown solder bumps 234 may be controlled collapse chip connection (C4) bumps. In an embodiment, a solder resist layer 212 may be formed over portions of the first side 261 of the tape substrate 210 and over portions of the conductive traces 224. By way of example, the solder resist layer 212 may be any solder resist material known in the art, such as, for example, a polymeric material or an epoxy material. Solder resist openings 228 may be patterned into the solder resist layer 212 to expose portions of the conductive traces 224 where solder bumps 234 are positioned.

According to an embodiment, each of the reflown solder bumps 234 may be electrically coupled to the device die 230 by a pillar 232. Each pillar 232 may provide an electrical connection to integrated circuitry (not shown) that is formed on or in the device die 230. In an embodiment, the pillars are a metallic material, such as, for example, copper, gold, aluminum, or alloys thereof. Additional embodiments include pillars that include a stack of one or more layers. For example, the pillars 232 may include barrier layers, organic surface protection (OSP) layers, metallic layers, or any combination thereof.

The use of pillars 232 in a flip chip package provides additional benefits compared to a package that only utilizes solder bumps 234. For example, the pillars 232 allow for an increased stand-off height. Also, the pillars 232 allow for a decrease in the pitch between the connections. While device package 200 illustrated in FIG. 2A includes pillars 232, embodiments are not limited to such configurations. For example, pillars 232 may optionally be omitted and the reflown solder bumps 234 may be directly coupled to the device die 230.

According to an embodiment, an underfill material 236 may be deposited below the device die 230 and between the reflown solder bumps 234 and pillars 232. In an embodiment, the underfill material 236 may be an epoxy underfill material. The epoxy underfill material 236 may include particulate reinforcements in certain embodiments. For example, the underfill material 236 may include filler particles made of silicon, glass, or the like. By way of example, the underfill material 236 may have a viscosity that allows for the underfill material to be dispensed with a capillary underfill process. Additional embodiments may include an underfill material 236 that has a viscosity suitable for use with a no-flow underfill process. Typically, underfill material that is used in a no-flow underfill process has a higher viscosity than underfill material that is used in a capillary underfill process. By way of example, the underfill material may have a viscosity between approximately 5.0 and 100 Pa·s. In an embodiment, the underfill material 236 may cover a portion of the edges 223 of the device die 230. As illustrated, underfill material 236 is not formed above the top surface of the device die 230, but embodiments are not limited to such configurations. For example, the underfill material 236 may be deposited to a thickness that allows for the underfill material 236 to be formed on the top surface of the device die 230.

Embodiments of the invention include a reinforcement layer 220 that is formed over a surface of the tape substrate 210. In the particular embodiment illustrated in FIG. 2A the reinforcement layer 220 is formed over solder resist layer 212 on the first surface 261 of tape substrate 210. In an additional embodiment, the reinforcement layer 220 may be in direct contact with the tape substrate and the conductive traces 224. An opening 229 formed through the reinforcement layer 220 may expose one or more solder resist opens 228 on the tape substrate 210. According to an embodiment of the invention, the width W of the opening 229 may be sized to fit one or more device dies 230. According to the embodiment depicted in FIG. 2A, the width W of the opening 229 is sized to accommodate a single device die 230. According to an embodiment, the width W of the opening 229 may be formed larger than the width of the device die 230. Increasing the width W of the opening 229 provides a larger gap G between sidewalls 225 of the opening 229 and the edges 223 of the device die 230. The increased size of the gap G may allow for the underfill material 236 to be deposited faster. As such, the throughput of the packaging process may be increased.

As more of the surface area of the tape substrate 210 is covered by the reinforcement layer 220, the stiffness of the tape substrate 210 increases and therefore, reduces the warpage. According to an embodiment, the size of the gap G is minimized in order to provide increased stiffness to the tape substrate 210. For example, the minimum size of the gap G may be dependent on the capillary underfill process. For example, underfill material that has a higher viscosity would require a larger gap size G compared to an underfill material that has a lower viscosity. By way of example, the gap G may be less than approximately 0.5 mm. Additional embodiments may include a gap G that is between approximately 0.5 mm and 4.0 mm.

Figure 2B:
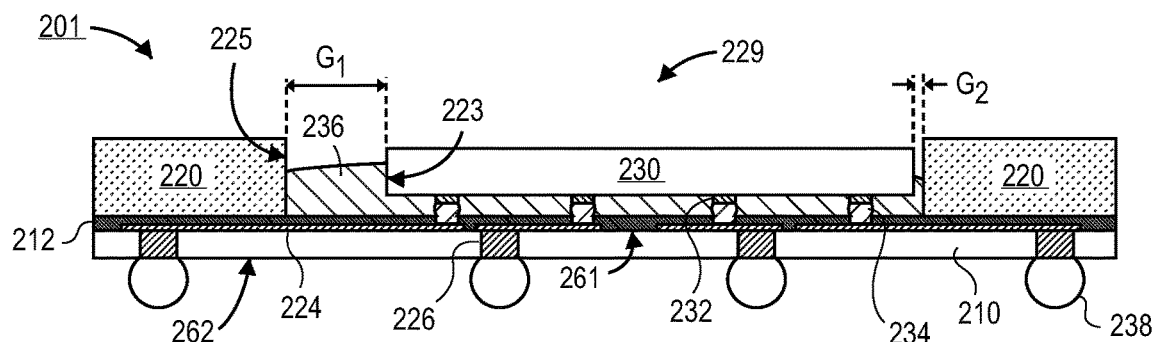

In an embodiment, the device die 230 may be mounted off-center from the opening 229. As such, the gaps between the sidewalls 225 of the opening and the edges 223 of the device die may not be equal. For example, a gap $G_1$ on one of the sides of the device die 230 may be larger or smaller than a gap $G_2$ on the opposite side of the device die 230. Such an embodiment is illustrated in FIG. 2B. The FCBGA device package 201 in FIG. 2B is substantially similar to the FCBGA device package 200 illustrated in FIG. 2A, except that the device die 230 is mounted off-center from the opening 229. In such embodiments, a first gap $G_1$ between an edge 223 of a device die 230 and a sidewall 225 of the opening 229 may be greater than a second gap $G_2$ between a second edge 223 of device die 230 and a second sidewall 225 of the opening 229. Positioning the device die 230 off-center allows for a gap to be formed large enough to allow for the dispensing of the underfill material, without needing to increase the width W of the opening 229. As such, a greater degree of stiffness may be obtained while still maintaining the rate at which the underfill material 236 may be deposited.

Returning to FIG. 2A, according to an embodiment of the invention, the reinforcement layer 220 may be molded to the tape substrate 210. In such embodiments, the reinforcement layer 220 may be a material suitable for molding. By way of example, the reinforcement layer 220 may be a polymer or epoxy material. In an embodiment, the material chosen for the reinforcement layer 220 may be chosen in order to match the coefficient of thermal expansion (CTE) of the tape substrate 210. By way of example, the tape substrate 210 may heave a CTE that is between approximately 10 ppm/° C. and 14 ppm/° C. In such embodiments the CTE of the reinforcement layer 220 may be chosen to match the CTE of the tape substrate 220 and therefore, the reinforcement layer 220 may also have a CTE between approximately 10 ppm/° C. and 14 ppm/° C.

The CTE of the reinforcement layer 220 may be modulated by increasing or decreasing the amount of filler material that is included in the epoxy used for the reinforcement layer 220. By way of example, the filler material may be silicon particles, glass particles, or the like. Matching the CTE values of the reinforcement layer 220 and the tape substrate 210 allows form improved control of the warpage of the die substrate 220 during the reflow processing used to attach the device die 230 to the tape substrate 210. For example, since the reinforcement layer 220 may be formed from a material that has substantially the same CTE as the tape substrate 210, there is no buckling in the tape substrate 210 that would otherwise result from different rates of expansion between the reinforcement layer 320 and the tape substrate 310.

The reinforcement layer 220 may be formed to a thickness TR that provides the desired stiffness to the tape substrate 210. As the thickness TR increases, the stiffness of the device package 200 becomes closer to the stiffness of the reinforcement layer 230. By way of example, the thickness TR of the reinforcement layer 220 may be chosen such that a top surface of the reinforcement layer 220 is formed above the top surface of the device die 230, as shown in FIG. 2A. Additional embodiments may include a reinforcement layer 220 that has a thickness chosen such that a top surface of the reinforcement layer 210 is substantially coplanar with or below the top surface of the device die 230. According to an embodiment, the thickness TR may be less than approximately 100 μm. Additional embodiments of the invention include a thickness TR that may be less than approximately 1.0 mm. For example, the thickness TR of the reinforcement layer 220 may be between approximately 100 μm and 1 mm, according to an embodiment.

Figure 2C:
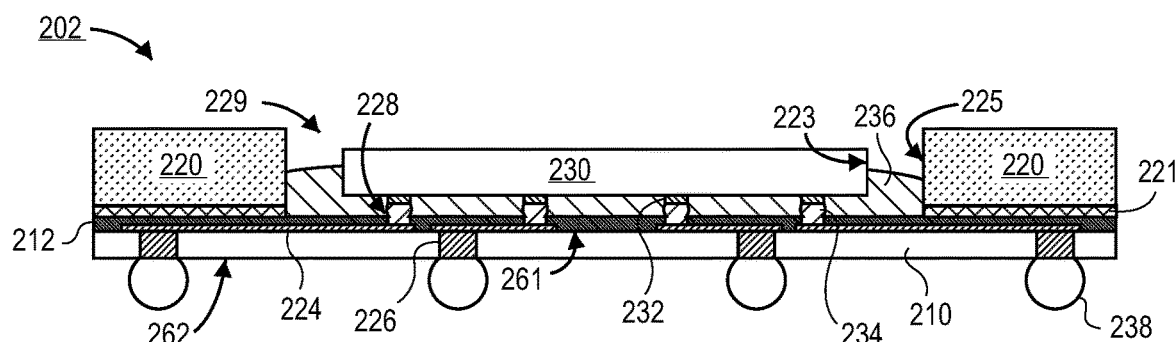

According to an additional embodiment, the reinforcement layer 220 may be attached to the tape substrate 210 with an adhesive layer 221, as shown in the cross-sectional illustration of a FCBGA device package 202 in FIG. 2C. In an embodiment, the adhesive layer 221 may be any adhesive commonly used in the art. In an embodiment, the adhesive may be a layer of adhesive that is laminated over the surface of the tape substrate 210, the surface of the reinforcement layer 220, or both. In an additional embodiment, the adhesive layer may be a glue that is spread over the surface of the tape substrate 210, the surface of the reinforcement layer 220, or both. By way of example, the adhesive may be an epoxy, a polyester, or an acrylic material.

The use of an adhesive layer 221 allows for materials that are not compatible with injection molding processes to be utilized for the reinforcement layer 220. For example, metallic materials may also be used for the reinforcement layer 220 when an adhesive layer 221 is used. By way of example, the reinforcement layer may be steel, stainless steel, aluminum, or the like. According to an additional embodiment, the reinforcement layer 220 may also be a non-metallic material. By way of example, the reinforcement layer 220 may also be a polymeric material, glass-reinforced epoxy laminate (e.g., FR4), Ajinomoto build-up films (ABF), ceramics, or the like.

The use of metallic materials for the reinforcement layer 220 are advantageous because the stiffness of such metallic materials is generally greater than the stiffness of molded materials, such as polymers and epoxies. As such, the thickness TR of the reinforcement layer 220 may be reduced compared to the thickness TR that would be needed to provide an equivalently stiff device package when a molded polymeric or epoxy material is used for the reinforcement layer 220. Accordingly, the overall package thickness may be reduced when the reinforcement layer 220 is adhered to the tape substrate 210 as opposed to molded to the tape substrate 210. Aside from the inclusion of the adhesive layer 221, device package 202 may be substantially similar to device package 200 illustrated in FIG. 2A.

Embodiments of the invention are able to perform flip-chip bonding on a thin substrate, such as a tape substrate, because a reinforcement layer is formed prior to the bonding process. Forming the reinforcement layer prior to bonding allows for the stiffness of the reinforcement layer to prevent warpage of the tape substrate 210. Further, the inclusion of a reinforcement layer prior to bonding allows for standard flip-chip processing equipment to be used, since the stiffness of the tape substrate is made closer to that of build-up substrates typically used for flip-chip bonding.

Referring now to FIGS. 3A-3I, a process for forming a device package according to an embodiment of the invention is provided. At FIG. 3A, a cross-sectional illustration of a tape substrate 310 is shown according to an embodiment of the invention. Embodiments of the invention include a tape substrate 310 that is a polymeric substrate. By way of example, the tape substrate 310 may be a polyamide or polyimide material. The tape substrate 310 may have a thickness T. By way of example, the thickness T may be less than approximately 100 μm. In an embodiment, the thickness T may be approximately 75 μm or less. In an embodiment, the tape substrate 310 may be a single layer tape substrate. Additional embodiments may also include multi-layer tape substrates, such as a substrate that includes two or more thin and flexible layers laminated together.

One or more conductive through vias 326 may be formed through the tape substrate 310. The conductive through vias 326 provide electrical connections between a first side 361 and a second side 362 of the tape substrate 310. In an embodiment, the conductive vias may be patterned through the tape substrate 310 with a laser ablation process. In an embodiment, the through vias 326 may be plated with a conductive material, such as copper. The through vias 326 may provide an electrical connection to second level interconnect (SLI) solder balls 338 formed on the second side 362 of the tape substrate 310 in a subsequent processing operation described with respect to FIG. 3H below.

As illustrated, conductive traces 324 may be formed over the first side 361 of the tape substrate 310. According to an embodiment, the conductive traces 324 may be a metallic material, such as copper or the like. In an embodiment, the conductive traces may be formed by etching away portions of a conductive layer laminated over the tape substrate 310. In an embodiment, a solder resist layer 312 may be formed over portions of the first side 361 of the tape substrate 310 and over portions of the conductive traces 324. By way of example, the solder resist layer 312 may be any solder resist layer known in the art, such as, for example, a polymeric material or an epoxy material. In an embodiment, the solder resist layer 312 is deposited with a screen printing process. Solder resist openings 328 may be patterned into the solder resist layer 312 to expose portions of the conductive traces 324. As illustrated, the solder resist openings 328 may be grouped together to form a plurality of C4 regions 327. Each of the C4 regions may be locations where a device die will be mounted with a flip-chop bonding process, described in greater detail below.

Figure 3D:
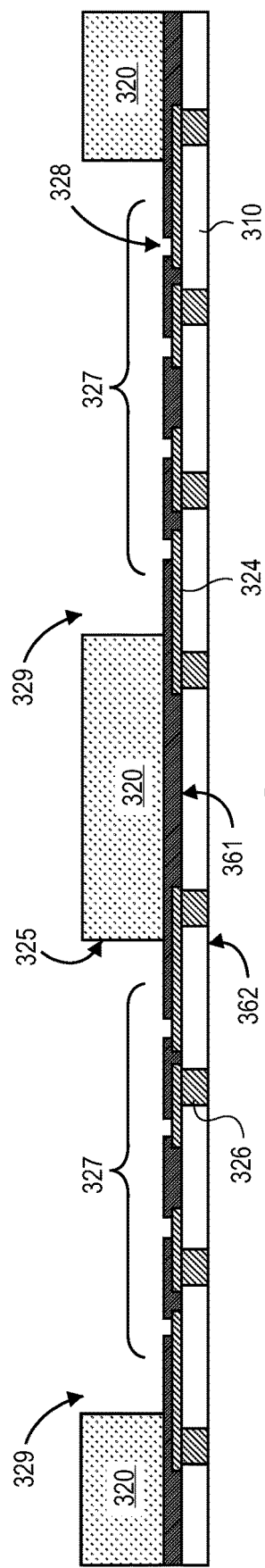
Figure 4A:
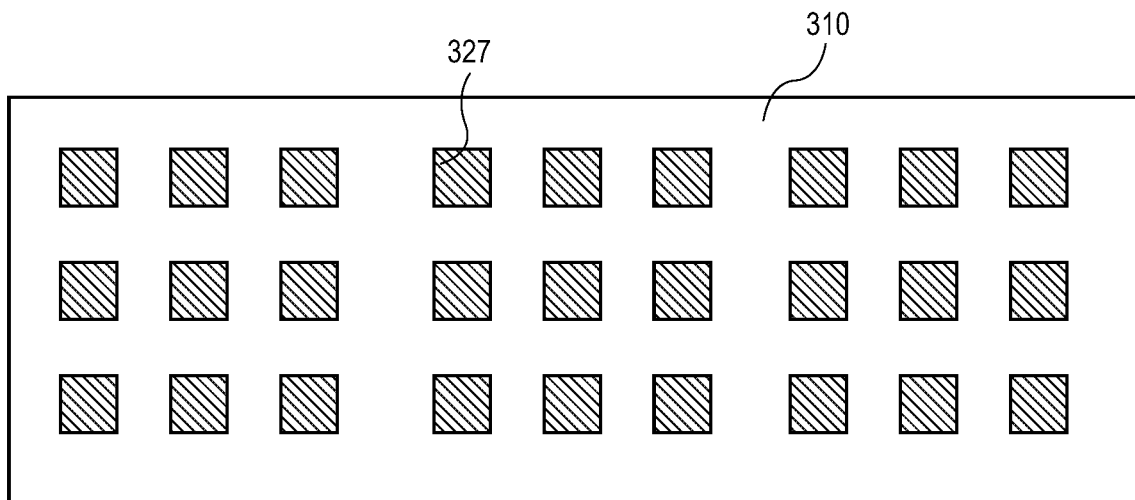
FIG. 4A is a schematic plan view of the processing operation illustrated in FIG. 3A, according to an embodiment of the invention.

Referring now to FIG. 4A, a schematic plan view of the tape substrate 310 illustrated in FIG. 3A is shown. In an embodiment, the tape substrate 310 is large enough to form a plurality of C4 regions 327. For simplicity, and to not unnecessarily obscure embodiments of the invention, each C4 region 327 is illustrated as a box. In an embodiment, each C4 region 327 may include a plurality of individual SROs 328 (not shown in FIG. 4A) for connecting a device die 330 to the conductive traces. Accordingly, embodiments allow for the formation of a plurality of device packages from a single tape substrate 310. By way of example, the tape substrate 310 may be a panel level substrate, a quarter-panel level substrate, a wafer level substrate, or any other size substrate.

Referring now to FIG. 3B, a cross-sectional illustration of a mold 350 positioned over the tape substrate 310 is shown. In an embodiment, the mold 350 may be in contact with the solder resist layer 312. According to an embodiment, the mold 350 may be a mold that is used for an injection molding process or a vacuum assisted injection molding process. The mold 350 includes one or more recesses 352 that are in the shape of the desired reinforcement layer 320. For example, the height H of the recesses 352 may be substantially equal to the desired thickness TR of the reinforcement layer 320. Additionally, the recesses 352 are spaced apart from each other by distance substantially equal to the desired width W of the opening 329 in the reinforcement layer 320.

According to an embodiment, the mold 350 may include a compliant layer 354 formed over a surface of the mold 350 that faces the first surface 361 of the tape substrate 310. The compliant layer 354 improves the seal for the mold and prevents the molding material from leaking into the C4 regions 327. By way of example, the compliant layer 354 may be a polymeric material or a rubber material. In an embodiment, a fluorinated polymeric material may be used for the compliant layer 354. In an embodiment, the compliant layer may be compliant enough to fill the SROs 328. According to the embodiment illustrated in FIG. 3B, the mold 350 includes a single component formed over the top surface 361 of the tape substrate, however embodiments are not limited to such configurations. For example, embodiments may also include a bottom mold piece that is positioned over the second surface 362 of the tape substrate 310. In such an embodiment, the bottom mold piece may be clamped to the upper mold piece (e.g., the mold 350) during the molding process.

After the mold 350 has been aligned and is secured to the tape substrate 310, a molding material may be injected into the mold 350 to form the reinforcement layer 320, as shown in FIG. 3C. In an embodiment, an injection molding process, or a vacuum assisted injection molding process may be used to inject the molding material into the mold 350. According to an embodiment, the molding material may be chosen to have a desired CTE. For example, the CTE of the molding material may be chosen to match the CTE of the tape substrate 310. By way of example, the CTE of the molding material may be between approximately 10 ppm/° C. and 14 ppm/° C. Additional embodiments include choosing the molding material based on the flow characteristics, such as viscosity. For example, a molding material with a lower viscosity may allow for the molding process to be performed faster relative to a molding process that utilizes a higher viscosity material. By way of example, the molding material may be an epoxy. In an embodiment, the molding material may include additional filler materials, such as silicon or glass particles that may be used to modulate the viscosity, CTE, and/or, the stiffness of the reinforcement layer 320.

Figure 4B:
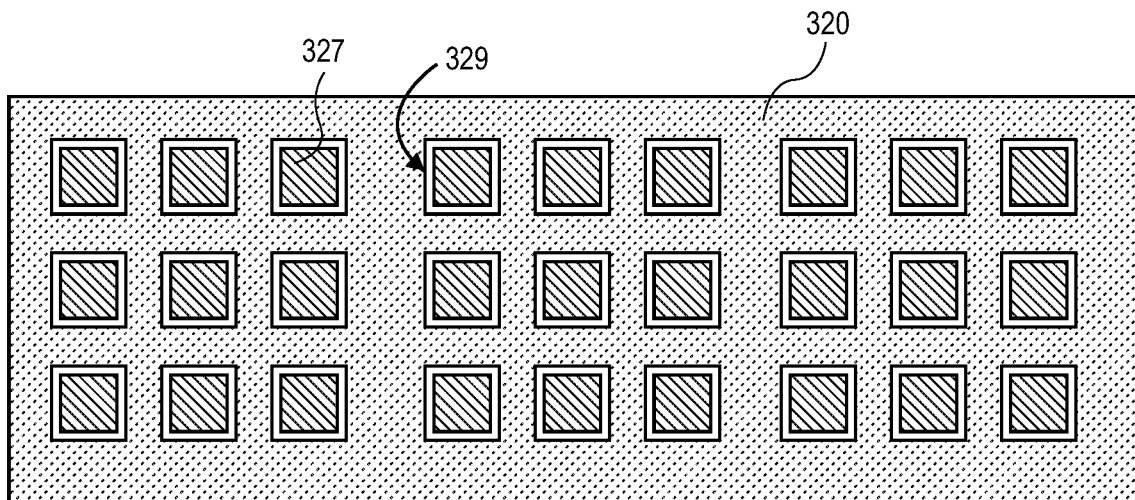
FIG. 4B is a schematic plan view of the processing operation illustrated in FIG. 3D, according to an embodiment of the invention.

Referring now to FIG. 3D, the mold 350 is removed from the surface of the tape substrate 310. The presence of the recesses 352 in the mold 350 results in the molding material taking the form of the reinforcement layer 320 around the C4 regions 327. As shown in the corresponding plan view in FIG. 4B, openings 329 in the reinforcement layer 320 may be larger than the C4 regions 327. While the C4 regions 327 are illustrated as substantially centered within square openings 329 in the reinforcement layer 320, embodiments are not limited to such configurations. For example, the outer perimeter of the C4 regions 327 may not be equidistant to each sidewall of the opening 329 in the reinforcement layer 320. In an embodiment, the outer perimeter of the C4 regions 327 may not be equidistant from each wall because the opening 329 is not the same shape as the C4 regions 327. For example, the outer perimeter of the C4 regions 327 may be substantially square, whereas the openings are substantially rectangular. Additional embodiments include C4 regions 327 that are off-center from the opening 329 in the reinforcement layer 320. Embodiments that do not include C4 regions 327 that are equidistant from the sidewalls of the reinforcement layer may be beneficial because they provide a larger gap G between the sidewalls of the reinforcement layer 320 and an edge of the device die 330 that will be mounted over the C4 regions 327. For example, such an off-center device die and C4 region are shown in the FCBGA package 201 illustrated in FIG. 2B.

According to an additional embodiment, the reinforcement layer 320 may be adhered to the tape substrate 310 instead of being molded onto the substrate. In such embodiments an adhesive layer may be formed on a bottom surface of the reinforcement layer 320 prior to aligning and attaching the reinforcement layer 320 to the tape substrate 310. Alternatively, the adhesive layer may be applied over portions of the tape substrate 310. By way of example, the adhesive may be an epoxy, a polyester, or an acrylic material. Such an embodiment would then follow substantially similar processing operations described below with respect to FIGS. 3E-3I and would result in a device package substantially similar to device package 202 illustrated in FIG. 2C, and therefore, will not be repeated herein.

Figure 3E:
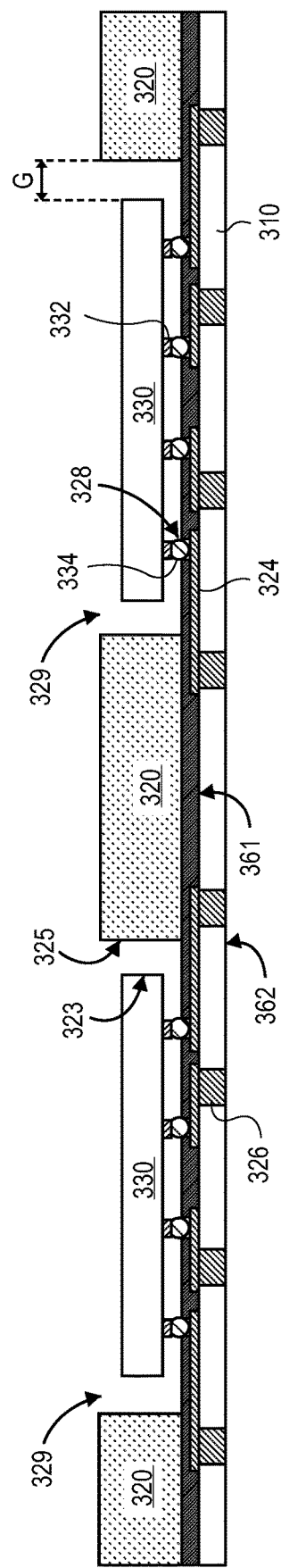
Figure 4C:
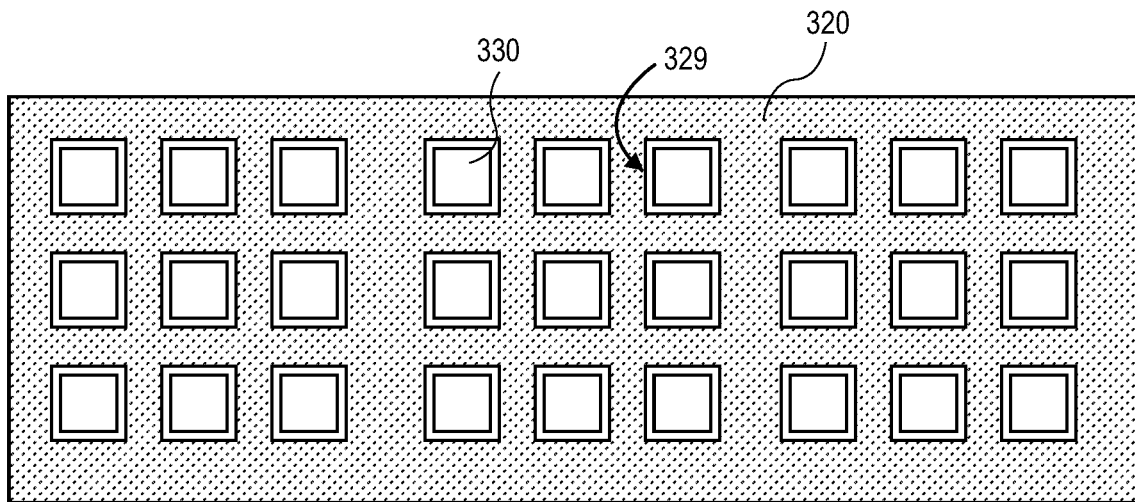
FIG. 4C is a schematic plan view of the processing operation illustrated in FIG. 3E, according to an embodiment of the invention.

Referring now to FIG. 3E, device die 330 are aligned over the C4 regions 327 and placed onto the tape substrate 310. In an embodiment, the device die are placed onto the tape substrate 310 with a pick and place tool. As shown in the corresponding schematic plan view in FIG. 4C, a plurality of device die 330 may each be aligned and placed over a C4 region 327 of the tape substrate 310. Returning to FIG. 3E, in an embodiment the device die 330 include one or more pillars 332. By way of example, the pillars 332 may be aligned such that each of the pillars 332 is aligned over a different SRO 328. The pillars 332 allow for an electrical connection to be made from the active devices in the device die 330 to the tape substrate 310.

In an embodiment, the pillars are a metallic material, such as, for example, copper, gold, aluminum, or alloys thereof. Additional embodiments include pillars that include a stack of one or more layers. For example, the pillars 232 may include barrier layers, OSP layers, metallic layers, or any combination thereof. In an embodiment, a solder bump 334, such as a C4 bump, is formed on each of the pillars 332 prior to the device die 330 being placed on the tape substrate 310. In an additional embodiment, the solder bumps 334 may each be formed over a SRO 328 prior to placing the device die 330 onto the tape substrate 310.

Figure 3F:
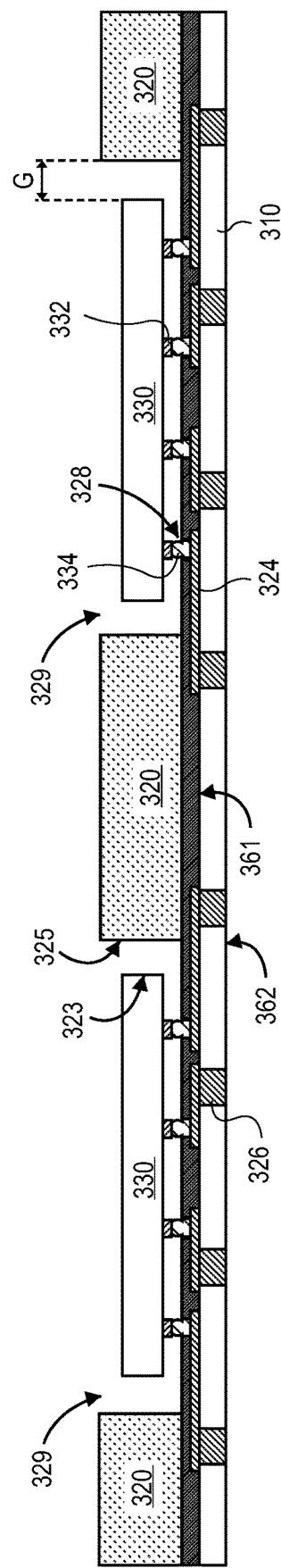

Referring now to FIG. 3F, the solder bumps are reflown. During the reflow, the solder may fill the SROs 328 and electrically couple the device die 330 to the traces 324 on the tape substrate 310. In an embodiment, the reflow is a mass reflow where each of the solder bumps are reflown simultaneously. According to an embodiment, the reflow temperature is a temperature sufficient to melt the solder bumps. By way of example, the reflow temperature may be greater than approximately 215° C. Additional embodiments include a reflow temperature between approximately 215° C. and 260° C. According to an embodiment, the reflow temperature does not cause the tape substrate 310 to substantially or permanently warp or otherwise deform because of the presence of the reinforcement layer 320. The stiffness of the reinforcement layer 320 prevents the warpage. Furthermore, since the reinforcement layer 320 may be formed from a material that has substantially the same CTE as the tape substrate 310, the tape substrate 310 does not buckle in the SRO region 327. For example, if the CTE of the tape substrate 310 and the reinforcement layer 320 are different, the tape substrate 310 and the reinforcement layer 320 may have different rates of expansion. The differing expansion rates may result in the SRO region 327 of the tape substrate 310 buckling or otherwise deforming.

Figure 3G:
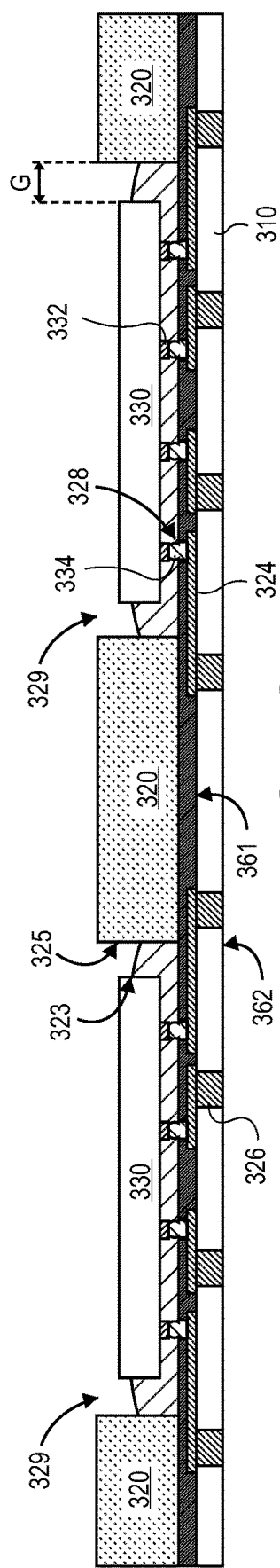

After the solder bumps 334 have been reflown, embodiments of the invention may include dispensing an underfill material 336 around the reflown solder bumps and interconnects. FIG. 3G is a cross-sectional illustration of the device package after the underfill material 336 has been dispensed around the solder bumps and interconnects. By way of example the underfill material 336 may be an epoxy material. In an embodiment, the underfill material 336 may have a viscosity suitable for capillary underfill processes. In such an embodiment, the underfill material 336 may be dispensed through one or more of the gaps G between an edge 323 of the device die 330 and a sidewall 325 of the reinforcement layer 320.

According to an additional embodiment, the underfill material 336 may be a no-flow underfill material. When a no-flow underfill material is used, the underfill material may be dispensed over the C4 regions 327 prior to placing the device die 330 onto the tape substrate 310. In an embodiment that utilizes a no-flow underfill material, the device die 330 may then be bonded to the tape substrate with a thermal compression bonding (TCB) process.

Figure 3H:
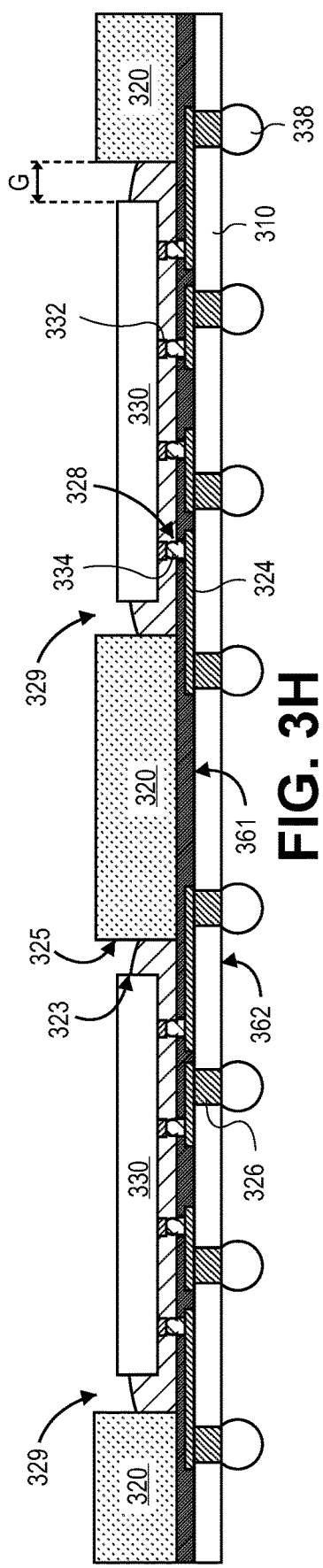

Referring now to FIG. 3H, a cross-sectional illustration of the device package is shown after a second level interconnect (SLI) ball attach process has been performed, according to an embodiment. As illustrated, embodiments include the formation of one or more second level solder bumps 338 on a second surface 362 of the tape substrate 310. In an embodiment, the second level solder bumps 338 may be formed with a ball drop process, a stencil printing process, a jetting process or the like. By way of example, each of the second level solder bumps 338 may be electrically coupled to one of the interconnects of the device die 330 by conductive traces 324 and through vias 326 formed through the tape substrate 310. In an embodiment, the second level solder bumps 338 may be any solder typically used in device packaging, such as lead-tin based solders, or lead-free solders.

Figure 3I:
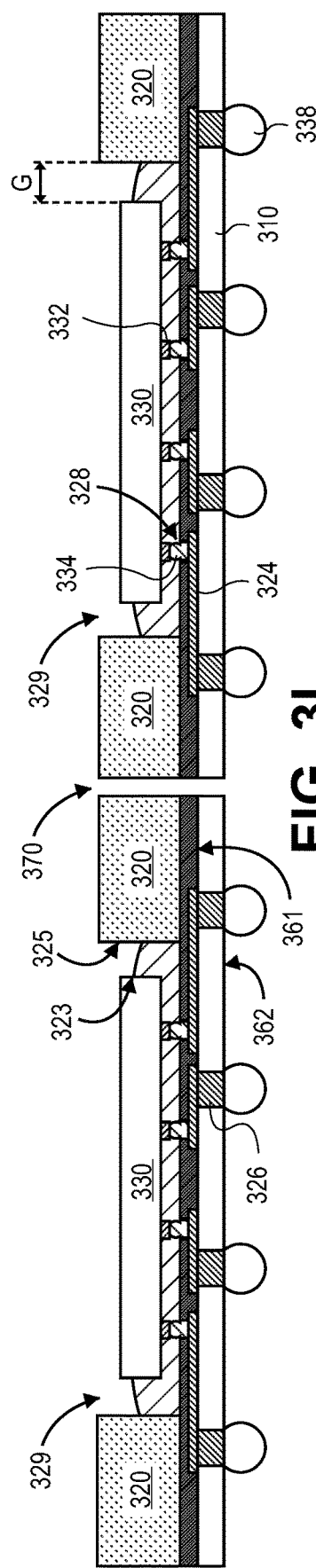

Referring now to FIG. 3I, embodiments of the invention include a singulation process that singulates each of the device packages from the tape substrate 310 along singulation lines 370. By way of example, the device packages may be singulated with a laser singulation or a sawing process.

Embodiments of the invention may also include device packages that have a second die mounted above the device die, and methods of making such device packages. For example, the second die may be a memory die that is electrically coupled to the integrated circuitry of the device die by local memory interconnects (LMI) pads formed over a top surface of the device die and through silicon vias (TSVs) formed through the device die. In an embodiment, the second die may be larger than the device die. As such, a portion of the second die may extend beyond the outer edges of the device die. Typically, in packages that include a larger second die mounted over a smaller device die, a mold layer needs to be formed around the device die in order to support the entire second die. These mold layers are generally formed with an exposed die molding process after the device die has been mounted to the substrate. However, the use of an exposed die molding process causes additional problems that may reduce product yield.

One such issue is that the mold used in an exposed die molding process may cause too much compressive pressure on the LMI pads that are formed over the surface of the first device die, even when a conformal layer is formed over the surface of the mold that contacts the device die. For example, the mold may apply a pressure between approximately 10 MPa and 100 MPa on the LMI pads. Such high pressures may cause the LMI pads to mechanically fracture. Additionally, the pressure from the mold may cause conductive traces and conformal dielectric material formed over the conductive traces to fracture as well.

Additionally, when the conformal layer contacts the LMI pads, electrostatic discharge (ESD) damage may damage the transistors of the device die. In some packages, the LMI pads may be electrically coupled directly to the integrated circuitry of the first device die by one or more TSVs. In such embodiments, any charge build-up on the conformal layer may be discharged directly to the circuitry in the device die and cause permanent damage to the device die.

Furthermore, the exposed die molding process may not be a perfectly clean process. For example, some molding material may be left over the top surface of the first device die and portions of the LMI pads. When molding material is present over the LMI pads, it may decrease the effectiveness of the bonding process used to connect the second die to the device die. For example, when the second die is bonded with a TCB process, the mold residue over the LMI pads may prevent electrical contact between the first device die and the second die.

Therefore, embodiments of the present invention are beneficial because the reinforcement layer 620 used to support the second die 631 is formed before the device die 630 is mounted to the substrate. Accordingly, the need for an exposed die molding process that would otherwise damage the LMI pads, cause ESD damage, or reduce the effectiveness of the bonding process, is eliminated. A process for forming such a package in accordance with embodiments of the invention is illustrated in FIGS. 6A-6B.

Referring now to FIG. 6A, a device package substantially similar to the one illustrated in FIG. 3G is provided. The processing used to form the device package illustrated in FIG. 6A is substantially similar to the processing used to form the package illustrated in FIG. 3G, and therefore, will not be repeated here. However, it is noted that the reinforcement layer is formed (e.g., by molding the reinforcement layer to the substrate or by using an adhesive to adhere a discrete reinforcement layer component to the substrate, as described in greater detail above) prior to mounting the device die 630 to the substrate 610.

While the processing used to form the package illustrated in FIG. 6A is substantially similar to the processing used to form the packaged shown in FIG. 3G, there are several difference in the package that are to be noted here. First, device die 630 may include one or more LMI pads 655. In an embodiment, the LMI pads may be plated with one or more layers of gold or other thin film plating material, such as copper, alloys of gold and copper, or the like. According to an embodiment, the LMI pads 655 may be electrically coupled to one or more conductive traces, such as copper traces, that are connected to one of one or more TSVs that are formed in the device die 630. Additional embodiments may include a dielectric layer, such as a solder resist layer, that is formed over portions of the traces. In an embodiment, the TSVs and the conductive traces couple the LMI pads 655 to the integrated circuitry of the first device die 630. For simplicity, and in order to not unnecessarily obscure embodiments of the invention, the traces, dielectric layer, TSVs, and integrated circuitry are omitted from the Figures.

Additionally, substrate 610 in FIG. 6A is illustrated as being substantially similar to the tape substrate 310 illustrated in FIGS. 3A-3I, however, embodiments are not limited to tape substrates. For example, substrate 610 may be a rigid substrate, such as a multi-layer build up structure. In an embodiment, the substrate 610 may have a core, or the substrate 610 may be a coreless substrate. By way of example, the substrate may include one or more alternating layers of dielectric material and conductive redistribution layers. In an embodiment, the substrate 610 may be formed with a subtractive process, an additive process, or a semi-additive process (SAP).

Referring now to FIG. 6B, a second die 631 is mounted to the device die 630. In an embodiment, the second die 631 is electrically and mechanically coupled to the LMI pads 655 by solder bumps 656. In additional embodiments, the electrical and mechanical coupling may be made with any interconnect, such as, for example, a land grid array, C4 bumps, etc. According to an embodiment, the solder bumps 656 may be mass reflown. Additional embodiments may include alternative bonding processes, such as a TCB process. In an embodiment, the second die 631 may be a memory die. By way of example, the memory die may be any type of memory die, such as, a static random access memory (SRAM), a dynamic random access memory (DRAM), a nonvolatile memory (NVM), etc.

In an embodiment, the second die 631 may have a width that is larger than the width of the first device die 630. In an embodiment, the width of the second die 631 is greater than the width of the opening 629. According to such embodiments, when the second die 631 is mounted over the first device die 630, portions of the second die 631 may extend over the top surface of the reinforcement layer 620. As such, the second die 631 may be supported along substantially all of its width. In an embodiment, a flux material 637 may also be used during the mounting of the second die 631. By way of example, the flux material 637 may be an epoxy-based flux. The flux material 637 may also be disposed along the entire width of the second die 631 in order to fill spaces between the second die 631 and the materials below the second die 631, such as the device die 630, the underfill layer 636 and/or the reinforcement layer 620. Accordingly, embodiments of the invention allow for the entire width of the second die 631 to be supported.

According to an embodiment, processing of the package illustrated in FIG. 6B may continue with substantially the same processing operations as illustrated and described above with respect to FIGS. 3H-3I, and therefore, will not be repeated in detail here. For example, in an embodiment, second level interconnects may optionally be formed over a second surface 662 of the substrate 610. Additionally, embodiments may include singulating the substrate 610 along singulation lines in order to form individual packages.

Therefore, embodiments of the invention are able electrically and mechanically couple a second die 631 to a device die 630 without experiencing the detrimental issues described above. For example, the LMI pads 655 are not exposed to high pressures during the formation of the reinforcement layer 620 that is used to support the extended width of the second die 631, because the reinforcement layer 620 is formed on the substrate 610 before the device die 630 is mounted to the substrate. Additionally, since the LMI pads 655 are not contacted with the mold, ESD damage will not occur in the device die 630. Furthermore, there is no risk that molding material residue will form over the LMI pads 655, and therefore, the bonding process is made easier and more reliable.

Figure 5:
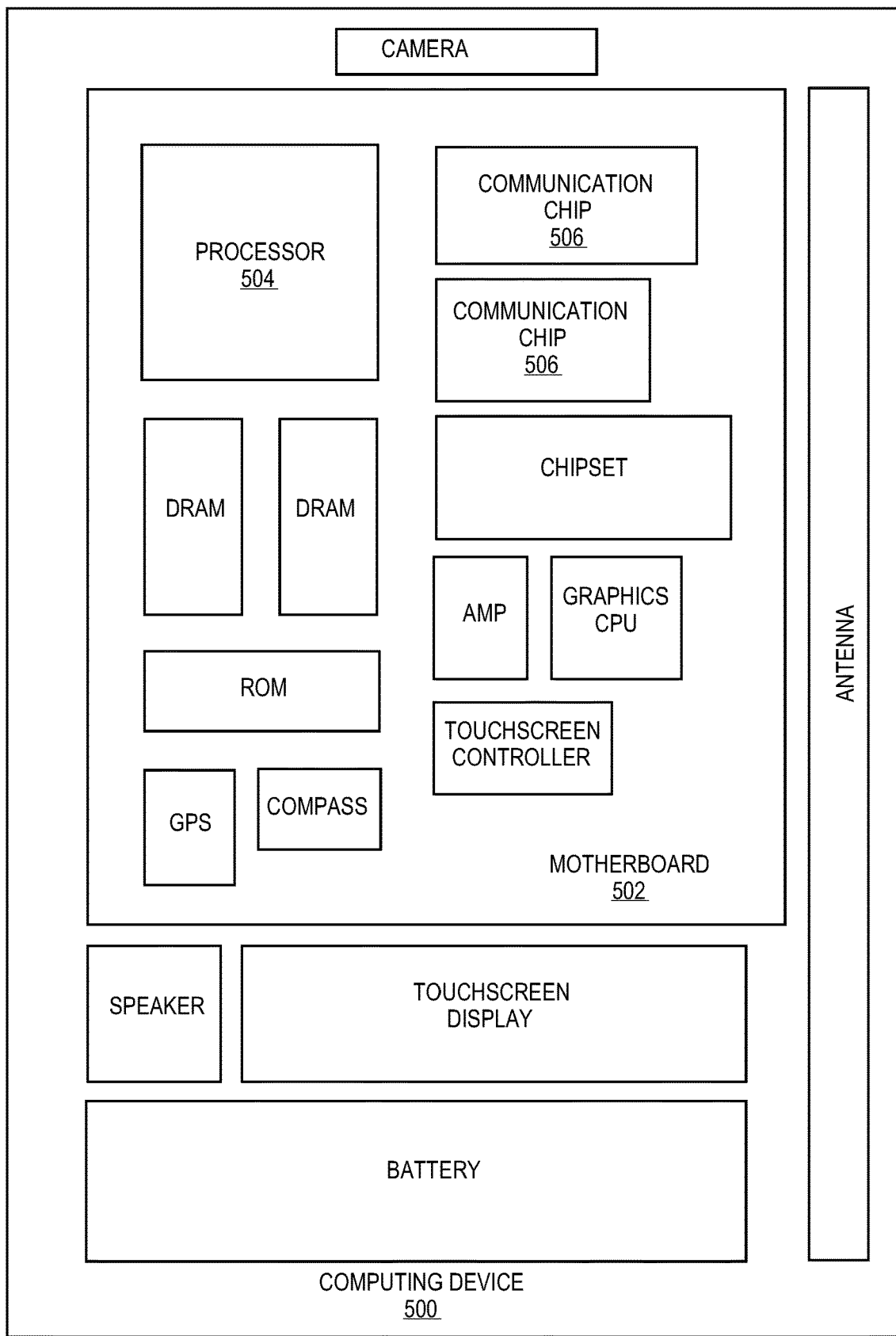
FIG. 5 is an illustration of a schematic block diagram of a computer system that utilizes a semiconductor package, according to an embodiment of the invention.

FIG. 5 illustrates a computing device 500 in accordance with an embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a microelectromechanical system (MEMS), a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some embodiments, the integrated circuit die of the processor is packaged in a device package having a tape substrate and a reinforcement layer over the tape substrate and surrounding the device die, in accordance with an embodiment of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another embodiment, the integrated circuit die of the communication chip is packaged in a device package having a tape substrate and a reinforcement layer over the tape substrate and surrounding the device die, according to an embodiment of the invention.

In further implementations, another component housed within the computing device 500 may contain an integrated circuit die that includes one or more devices, such as devices that are packaged in a device package having a tape substrate and a reinforcement layer over the tape substrate and surrounding the device die, in accordance with an embodiment of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

An embodiment of the invention may include a method for forming a device package comprising, forming a reinforcement layer over a substrate, wherein one or more openings are formed through the reinforcement layer, placing a device die into one of the openings, bonding the device die to the substrate by reflowing one or more solder bumps positioned between the device die and the substrate. An additional embodiment may include forming a device package, wherein forming the reinforcement layer comprises, placing a mold over the surface of the substrate, injecting a molding material into the mold, and removing the mold from the substrate. An additional embodiment may include forming a device package, wherein the mold comprises one or more recesses and a compliant liner. An additional embodiment may include forming a device package, wherein the molding material is injected into the mold with an injection molding process. An additional embodiment may include forming a device package, wherein the injection molding process is a vacuum assisted injection molding process. An additional embodiment may include forming a device package, wherein the molding material is an epoxy. An additional embodiment may include forming a device package, wherein the epoxy comprises reinforcement particles. An additional embodiment may include forming a device package, wherein forming the reinforcement layer comprises, applying an adhesive layer to a surface of the reinforcement layer, placing the reinforcement layer over the substrate, wherein the adhesive layer mechanically couples the reinforcement layer to the substrate. An additional embodiment may include forming a device package, wherein the reinforcement layer is steel, stainless steel, or aluminum. An additional embodiment may include forming a device package, wherein the one or more solder bumps are formed on the device die prior to the device die being placed into the opening. An additional embodiment may include forming a device package, wherein each of the one or more solder bumps are formed on separate metallic pillars that are electrically coupled to integrated circuitry of the device die. An additional embodiment may include forming a device package, wherein a first gap between a first edge of the device die and a first sidewall of the opening is larger than a second gap between a second edge of the device die and a second sidewall of the opening. An additional embodiment may include forming a device package, further comprising, electrically and mechanically coupling a second die to a top surface of the device die, wherein a width of the second die is wider than a width of the opening, and wherein a portion of the second die is supported by the reinforcement layer. An additional embodiment may include forming a device package, wherein the second die is a memory die that is electrically coupled to integrated circuitry of the device die by one or more through vias formed in the device die, one or more conductive traces formed over a surface of the device die, and one or more local memory interconnects formed over a surface of the device die. An additional embodiment may include forming a device package, wherein a thickness of the substrate is less than approximately 100 µm.

An embodiment of the invention may include a device package comprising, a substrate having one or more conductive traces formed over a first surface of the substrate, one or more conductive through vias formed from the first surface of the substrate to a second surface of the substrate that is opposite from the first surface of the substrate, wherein one or more of the conductive vias are electrically coupled to a conductive trace, a reinforcement layer formed over the substrate, wherein the reinforcement layer has one or more openings that expose portions of the conductive traces, and a device die electrically coupled to the one or more conductive traces by one or more solder bumps. An additional embodiment may include a device package, wherein the reinforcement layer is an epoxy material. An additional embodiment may include a device package, wherein the reinforcement layer is coupled to the substrate by an adhesive layer. An additional embodiment may include a device package, wherein the reinforcement layer is steel, stainless steel, or aluminum. An additional embodiment may include a device package, further comprising, a solder resist layer formed over portions of the substrate and over portions of the conductive traces, and one or more solder resist openings formed through portions of the solder resist layer exposed by the opening in the reinforcement layer. An additional embodiment may include a device package, wherein a first gap between a first edge of the device die and a first sidewall of the opening is larger than a second gap between a second edge of the device die and a second sidewall of the opening. An additional embodiment may include a device package, further comprising, a second die mechanically and electrically coupled to a top surface of the device die, wherein a width of the second die is wider than a width of the opening, and wherein a portion of the second die is supported by the reinforcement layer.

An embodiment of the invention may include a device package comprising, a substrate having one or more conductive traces formed over a first surface of the substrate, wherein a thickness of the substrate is less than 100 μm, one or more conductive through vias formed from the first surface of the substrate to a second surface of the substrate that is opposite from the first surface of the substrate, wherein each of the one or more conductive vias are electrically coupled to a conductive trace, a reinforcement layer formed over the substrate, wherein the reinforcement layer has one or more openings that expose portions of the conductive traces, a device die electrically coupled to the one or more conductive traces by one or more solder bumps, an underfill material disposed between the device die and the substrate and around the one or more solder bumps, a second die mechanically and electrically coupled to a top surface of the device die, wherein a width of the second die is wider than a width of the opening, and wherein a portion of the second die is supported by the reinforcement layer, and one or more second level interconnects formed on the second side of the substrate. An additional embodiment may include a device package, further comprising, an adhesive layer formed between the reinforcement layer and the substrate, wherein the reinforcement layer is steel, stainless steel, or aluminum. An additional embodiment may include a device package, wherein a first gap between a first edge of the device die and a first sidewall of the opening is larger than a second gap between a second edge of the device die and a second sidewall of the opening.

What is claimed is:

1. A semiconductor package, comprising:
    a substrate having a first conductive trace and a second conductive trace thereon;
    a device die attached to the substrate, the device die having a first side and a second side, the second side opposite the first side;
    a reinforcement layer coupled to the substrate, the reinforcement layer having a first portion laterally spaced apart from the first side of the device die, and the reinforcement layer having a second portion laterally spaced apart from the second side of the device die, wherein the first conductive trace extends from a first location beneath the device die to a location beneath the first portion of the reinforcement layer, and the second conductive trace extends from a second location beneath the device die to a location beneath the second portion of the reinforcement layer; and
    an adhesive layer between the reinforcement layer and the substrate.

2. The semiconductor package of claim 1, wherein the device die is electrically coupled to the first conductive trace by a first solder bump, and the device die is electrically coupled to the second conductive trace by a second solder bump.

3. The semiconductor package of claim 1, wherein the reinforcement layer comprises stainless steel.

4. The semiconductor package of claim 1, wherein the adhesive layer comprises an epoxy.

5. The semiconductor package of claim 1, wherein the substrate comprises a solder resist over the first and second conductive traces.

6. The semiconductor package of claim 1, wherein a distance of a gap between the first side of the device die and the first portion of the reinforcement layer is substantially the same as a distance of a gap between the second side of the device die and the second portion of the reinforcement layer.

7. The semiconductor package of claim 1, wherein a distance of a gap between the first side of the device die and the first portion of the reinforcement layer is greater than a distance of a gap between the second side of the device die and the second portion of the reinforcement layer.

8. The semiconductor package of claim 1, wherein the reinforcement layer has a substantially square outer perimeter.

9. The semiconductor package of claim 8, wherein the reinforcement layer has a substantially square opening.

10. The semiconductor package of claim 1, wherein the reinforcement layer has a rectangular opening.

11. The semiconductor package of claim 1, wherein the reinforcement layer has a substantially square opening.

12. The semiconductor package of claim 1, wherein the reinforcement layer has a thickness in a range between 100 microns and 1 mm.

13. The semiconductor package of claim 1, wherein the reinforcement layer has a thickness greater than a thickness of the device die.

14. A computing device, comprising:
    a board; and
    a semiconductor package coupled to the board, the semiconductor package, comprising:
        a substrate having a first conductive trace and a second conductive trace thereon;
        a device die attached to the substrate, the device die having a first side and a second side, the second side opposite the first side;
        a reinforcement layer coupled to the substrate, the reinforcement layer having a first portion laterally spaced apart from the first side of the device die, and the reinforcement layer having a second portion laterally spaced apart from the second side of the device die, wherein the first conductive trace extends from a first location beneath the device die to a location beneath the first portion of the reinforcement layer, and the second conductive trace extends from a second location beneath the device die to a location beneath the second portion of the reinforcement layer; and
        an adhesive layer between the reinforcement layer and the substrate.

15. The computing device of claim 14, further comprising:

a memory die coupled to the board.

16. The computing device of claim 14, further comprising:

a communication chip coupled to the board.

17. The computing device of claim 14, further comprising:

a battery coupled to the board.

18. The computing device of claim 14, further comprising:

a speaker coupled to the board.

19. The computing device of claim 14, further comprising:

a GPS coupled to the board.

20. The computing device of claim 14, further comprising:

a camera coupled to the board.

\* \* \* \* \*